(12) United States Patent
Whatcott

(10) Patent No.: US 10,109,939 B2
(45) Date of Patent: Oct. 23, 2018

(54) FLEX CIRCUIT CONNECTOR CONFIGURATION

(71) Applicant: Rosemount Aerospace Inc., Burnsville, MN (US)

(72) Inventor: Neal R. Whatcott, Carver, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 84 days.

(21) Appl. No.: 15/071,745

(22) Filed: Mar. 16, 2016

(65) Prior Publication Data

US 2017/0271792 A1    Sep. 21, 2017

(51) Int. Cl.
| | | |
|---|---|---|
| *H01R 12/62* | (2011.01) | |
| *H05K 1/14* | (2006.01) | |
| *F42B 35/00* | (2006.01) | |
| *F42C 19/06* | (2006.01) | |
| *H05K 1/02* | (2006.01) | |
| *H05K 3/36* | (2006.01) | |
| *F42B 15/10* | (2006.01) | |
| *H05K 7/14* | (2006.01) | |

(52) U.S. Cl.
CPC .............. *H01R 12/62* (2013.01); *F42B 35/00* (2013.01); *F42C 19/06* (2013.01); *H05K 1/028* (2013.01); *H05K 1/14* (2013.01); *H05K 1/147* (2013.01); *H05K 1/148* (2013.01); *H05K 3/368* (2013.01); *F42B 15/10* (2013.01); *H05K 7/1434* (2013.01); *H05K 2201/09027* (2013.01); *H05K 2201/09063* (2013.01)

(58) Field of Classification Search
CPC .......... H05K 1/148; H05K 1/14; H05K 1/028; H05K 1/147; H05K 3/368; H05K 7/1434; H05K 2201/09027; H05K 2201/09063; H01R 12/62; F42B 15/10; F42B 35/00; F42C 19/06
See application file for complete search history.

(56) References Cited

U.S. PATENT DOCUMENTS

| | | | |
|---|---|---|---|
| 4,264,115 A | | 4/1981 | Chow |
| 4,509,109 A | * | 4/1985 | Hansen .................. H01F 5/003 310/14 |
| 5,747,743 A | * | 5/1998 | Kato ...................... H05K 1/028 174/254 |
| 6,287,021 B1 | | 9/2001 | Katoh et al. |

(Continued)

FOREIGN PATENT DOCUMENTS

WO        2015175039 A2    11/2015

OTHER PUBLICATIONS

Extended European Search Report for EP Application No. 17161125.4, dated Jul. 31, 2017, 8 pages.

*Primary Examiner* — Pete Lee
(74) *Attorney, Agent, or Firm* — Kinney & Lange, P.A.

(57) ABSTRACT

An electronic system includes first and second circuit boards and a flexible circuit connector. The flexible circuit connector is configured to electrically connect the first and second circuit boards. The flexible circuit connector includes first and second connectors and a spiral portion. The first connector is configured to connect to the first circuit board. The second connector is configured to connect to the second circuit board. The spiral portion is connected between the first and second circuit boards and includes a circumferential portion that extends around the second connector.

14 Claims, 3 Drawing Sheets

(56) References Cited

U.S. PATENT DOCUMENTS

| | | |
|---|---|---|
| 6,744,637 B2 | 6/2004 | Blazic et al. |
| 6,778,389 B1 * | 8/2004 | Glovatsky ............. H01L 25/065 165/80.1 |
| 7,531,752 B2 * | 5/2009 | Hirakata ................ H05K 1/028 174/254 |
| 7,866,449 B2 | 1/2011 | Lehmann et al. |
| 8,559,191 B2 | 10/2013 | Porter et al. |
| 8,635,937 B2 | 1/2014 | Angeloff et al. |
| 2002/0187803 A1 * | 12/2002 | Nakamura .......... H04M 1/0216 455/550.1 |
| 2004/0154824 A1 * | 8/2004 | Hesse .................. H01R 35/025 174/117 F |
| 2006/0176677 A1 | 8/2006 | Glovatsky et al. |
| 2008/0182435 A1 * | 7/2008 | Ho ....................... H01R 35/025 439/77 |
| 2010/0159714 A1 * | 6/2010 | Zieger .................. H05K 1/189 439/55 |
| 2012/0242364 A1 * | 9/2012 | Ohmayer ................ G01F 23/00 324/756.05 |

* cited by examiner

FLEX CIRCUIT CONNECTOR CONFIGURATION

BACKGROUND

The present invention relates generally to electronic circuits, and in particular to flex circuit connector configurations.

In airborne devices, such as guided projectiles, the devices may include multiple electronic subsystems. These subsystems often need to communicate with one another electronically. The wires utilized to interconnect these subsystems must be long enough to connect the subsystems when the device is both assembled and disassembled. For example, when servicing a device, two parts of the device may be detached and pulled apart from one another to allow a technician access to the internal components of the device. The wires must be long enough to accommodate detachment of the two parts without causing undue stress on the wires or the components they are connected to.

In prior art devices, wire harnesses were implemented to connect circuit boards of the various subsystems. These harnesses were folded back and forth upon themselves and stuffed within an open compartment of the device. These folds of the harness can cause undue stress upon the wires, especially in devices such as guided projectiles that experience high g-forces during operation. Folding the wire harnesses back and forth upon themselves also takes up space within the device that could be utilized for other purposes. It is desirable to implement a more efficient and effective method for interconnecting internal subsystems of devices.

SUMMARY

A flexible circuit connector for connecting first and second circuit boards of a device includes a first connector, a second connector and a spiral portion. The first connector is configured to connect to the first circuit board and the second connector is configured to connect to the second circuit board. The spiral portion is connected between the first and second connectors and includes a circumferential portion that extends around the second connector.

An electronic system includes first and second circuit boards and a flexible circuit connector. The flexible circuit connector is configured to electrically connect the first and second circuit boards. The flexible circuit connector includes first and second connectors and a spiral portion. The first connector is configured to connect to the first circuit board. The second connector is configured to connect to the second circuit board. The spiral portion is connected between the first and second circuit boards and includes a circumferential portion that extends around the second connector.

DETAILED DESCRIPTION

A flex connector is disclosed herein that includes a spiral portion for connecting multiple subsystems of a device. The flex connector is configured to reduce stress applied to the connector while the device is in an operational state while also allowing easy access for maintenance while the device is in a disassembled state. The connector is connected between two circuit boards. The spiral portion connects first and second connector portions of the flex connector. The spiral portion includes a circumferential portion that extends around the second connector and is configured in a common plane with the second connector while the device is in an operational state. When the device is disassembled (e.g., two portions of the device are pulled apart from one another), the spiral portion allows the circuit boards to remain connected without creating any undue stress on either the flex connector or any of the components of the device.

Figure 1:
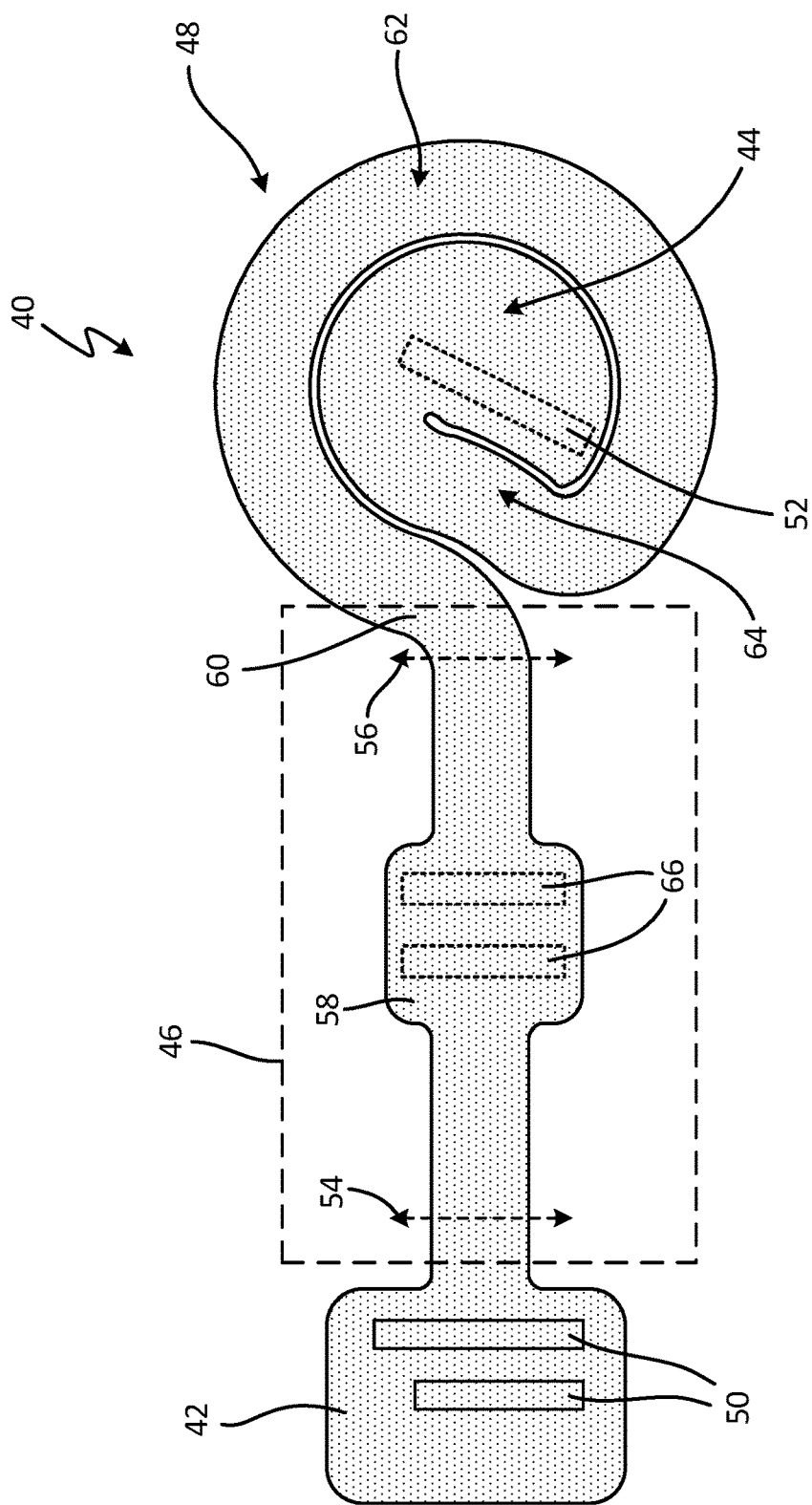
FIG. 1 is a diagram illustrating a configuration of a flex connector for use in connecting multiple electronic systems.

FIG. 1 is a diagram illustrating a configuration of flex connector 40 for use in connecting multiple electronic systems. Flex connector 40 includes connector portions 42 and 44, middle portion 46 and spiral portion 48. Connector portion 42 includes topside connectors 50 and connector portion 44 includes underside connectors 52. Middle portion 46 includes bend points 54 and 56, connector portion 58 and curved portion 60. Spiral portion 48 includes circumferential portion 62 and curved portion 64. Connector portion 58 includes underside connectors 66. While illustrated in FIG. 1 as topside connectors 50 and underside connectors 52 and 66, connectors 50, 52 and 66 may be implemented on either surface of connector portions 42, 44 and 58 depending on the configuration of the electronic systems for which flex connector 40 is connecting.

Bend points 54 and 56 are designated points on middle portion 46 for which flex connector 40 will bend while in an operational state. For example, a device may have circuit boards that are parallel to one another while the device is in the operational state. In this embodiment, bend points 54 and 56 are the designated points of flex connector 40 that will provide a 90° gradual bend, for example, to facilitate connection of connectors 50 and 52 to the circuit boards. Bend points 54 and 56 are the only points of flex connector 40 that are bent during an operational state of the device. This reduces the overall stress placed upon flex connector 40 while the device is operational.

Middle portion 46 may also include connector portion 58 to allow connection, for example, to external systems or other subsystems of a device. For example, the device may include an external port within its housing to allow for connection to connectors 66. This may facilitate, for example, connection to the electronic systems of the device without the need to open the device. This way, diagnostics may easily be run on the device while the device remains in an operational state. In other embodiments, connectors 66 may be implemented to connect to further electronic subsystems of a device, providing more efficient use of the internal spaces of the device.

Spiral portion 48 allows connector portions 44 and 46 to move apart and away from one another without causing any undue stress on flex connector 40. Curved portion 60 connects bend point 56 to circumferential portion 62. Curved portion 60 includes a turn that transitions the lateral direction of middle portion 46 into the circular direction of circumferential portion 62. Circumferential portion 62 extends around connector portion 44. Circumferential portion 62 may complete a 360° revolution around connector portion 44, as is illustrated in the embodiment shown in FIG. 1. In other embodiments, circumferential portion 62 may extend greater than or less than 360° around connector portion 44, depending upon the desired distance connector portions 42 and 44 may be pulled apart from one another without creating any undue stress upon flex connector 40 or any other components of the device. In an operational state, circumferential portion 62 is configured in a common plane with connector portion 44.

Flex connector 40 may be implemented as any type of flexible electronics, for example, such as electronic circuits mounted on flexible plastic substrates. Connector portions 42, 44 and 58 of flex connector 40 may be implemented as either flexible electronics, or as rigid printed circuit boards, for example. Flex connector 40 may include only electrical interconnections between connectors 42, 44 and 58, or may include other electronic circuit components, for example. To accommodate a greater number of electrical interconnections, flex connector 40 may include more than one layer. For example, several flex connectors 40 may be connected to common connectors 42, 44 and 58 to provide a greater number of electrical interconnections between connectors 42, 44 and 58.

Figure 2:
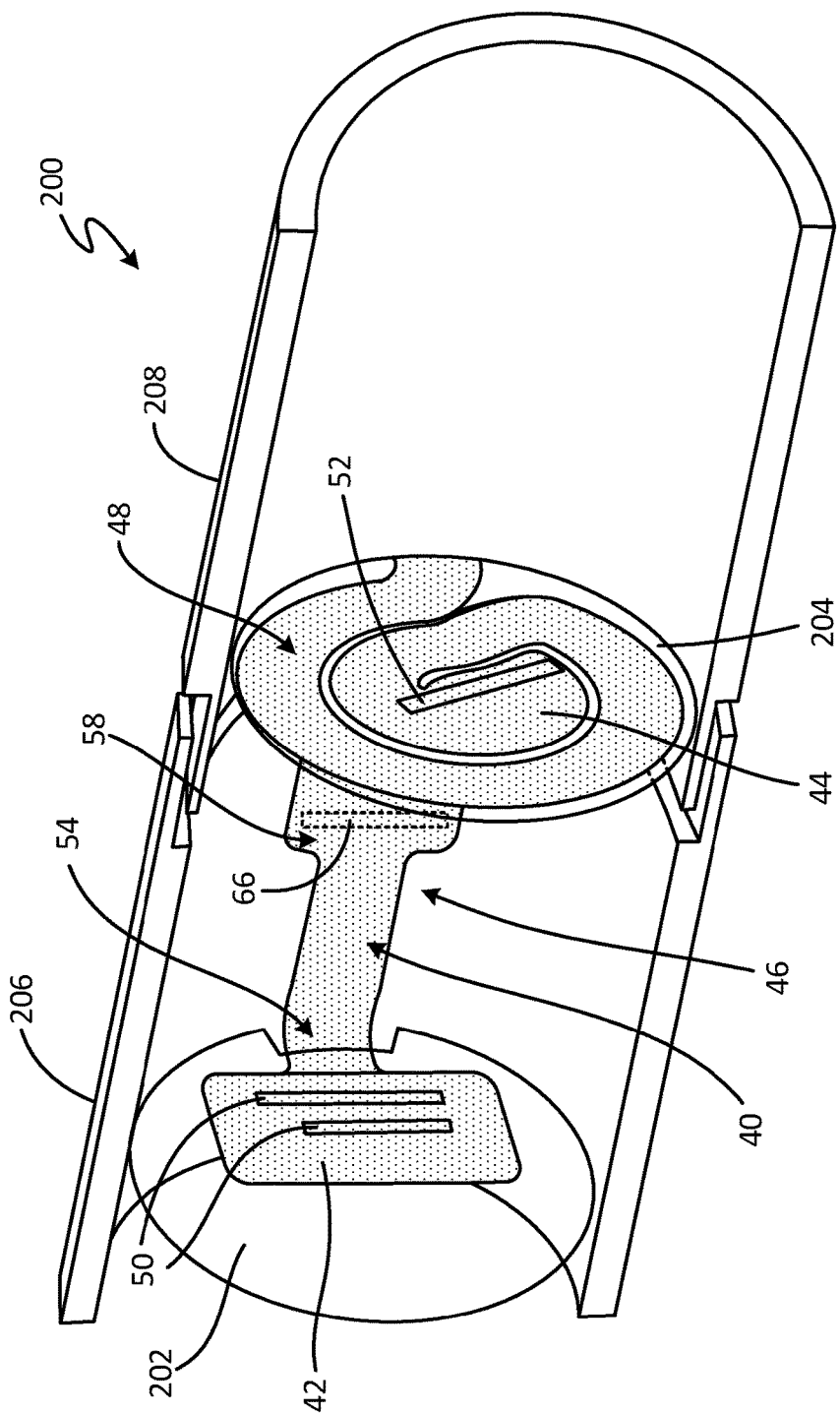
FIG. 2 is a diagram illustrating a device in an operational state that includes circuit boards connected by a flex connector.

FIG. 2 is a diagram illustrating device 200 in an operational state that includes circuit boards 202 and 204 connected by flex connector 40. Device 200 may include compartments 206 and 208. Circuit board 202 may be positioned within compartment 206 and circuit board 204 may be positioned within compartment 208. Device 200 is any device in which electronic circuits must connect to one another such as, for example, airborne munitions.

Connectors 50 may be connected to circuit board 202 and connector 52 may be connected to circuit board 204. In the operational state illustrated in FIG. 2, connector portions 42 and 44 are substantially parallel to one another based upon the parallel configuration of circuit boards 202 and 204. Middle portion 46 extends along an inside surface of device 200 across both compartments 206 and 208. While illustrated as connecting to circuit board 202 utilizing topside connectors, connector portion 42 may be configured to connect to either side of circuit board 202. Bend point 54 bends gradually around circuit board 202 through an opening between circuit board 202 and an inside surface of compartment 206. While illustrated as connecting to circuit board 204 using underside connectors, connector portion 44 may be configured to connect to either side of circuit board 204.

Middle portion 46 may be perpendicular to circuit boards 202 and 204 and may run along an inside surface of device 200. Because spiral portion 48 exists in the same plane as connector portion 44, flex connector 40 takes up minimal space within device 200 while device 200 is in an operational state. Additionally, in high stress environments, such as that of an airborne munition, spiral portion 48 being in the same plane as connector portion 44 minimizes the stress placed on flex connector 40 due to g-forces experienced by device 200. In prior art systems, electrical connectors between circuit boards 202 and 204 were folded back and forth upon themselves during operational states of device 200. These folds can cause unwanted stress for the electrical connector, which can be exacerbated in high g-force environments. By utilizing flex connector 40, stresses experienced by the electrical connectors can be minimized. While illustrated as free within compartments 206 and 208, a physical channel may also be implemented within compartments 206 and 208 through which middle portion 46 may run. This would separate flex connector 40 from other internal components, further reducing the stress placed upon flex connector 40 during operation of device 200.

Another advantage of utilizing flex connector 40 is connector portion 58. An access port (not shown) may be included in compartment 206 to allow access to connector 66. This may allow, for example, external systems, separate from circuit boards 202 and 204, such as diagnostic systems to connect to the internal electronics of device 200 without the need of disassembling device 200. In another embodiment, another circuit board may be implemented within compartment 206 to which connector portion 58 connects.

Figure 3:
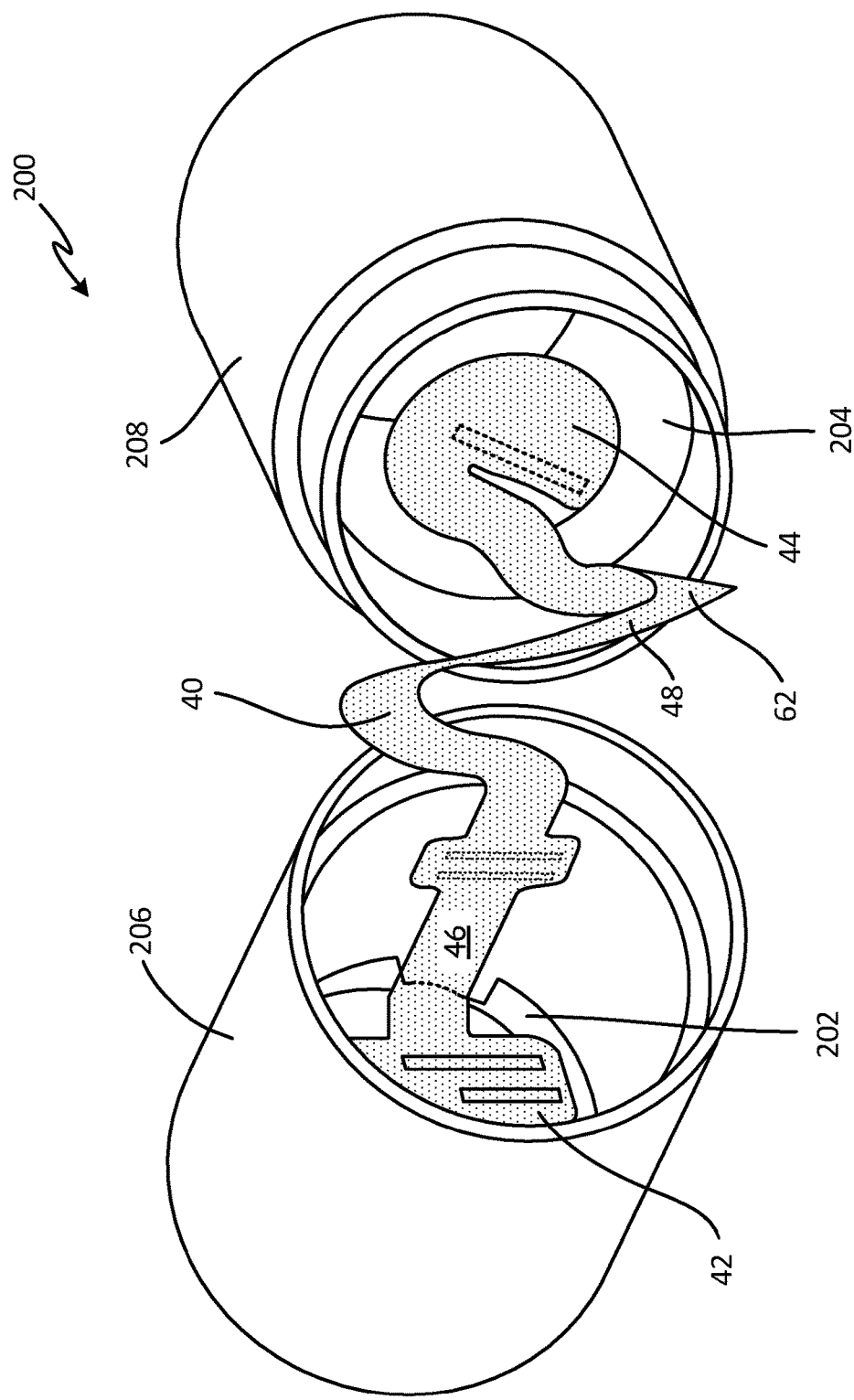
FIG. 3 is a diagram illustrating a device in a disassembled state that includes circuit boards connected by a flex connector.

FIG. 3 is a diagram illustrating device 200 in a disassembled state. In the embodiment illustrated in FIG. 3, compartments 206 and 208 are detached at 90°, with flex connector 40 continuing to connect circuit boards 202 and 204. This provides ease of access to internal components while performing maintenance, for example, without the need for disconnection of circuit boards 202 and 204 and without undue stress placed upon flex connector 40.

As seen in FIG. 3, spiral portion 48 allows connector portions 42 and 44 to pull apart and away from one another. As connector portion 44 is pulled away from connector portion 42, for example, circumferential portion 62 is pulled out of the common plane and away from connector portion 44. Because circumferential portion 62 is substantially circular and gradually bends around connector portion 44, circumferential portion 62 may be pulled outward toward middle portion 46 without experiencing high amounts of stress. As illustrated in FIG. 3, this allows compartments 206 and 208 to be fully disconnected and pulled apart at a full 90° or greater.

Discussion of Possible Embodiments

The following are non-exclusive descriptions of possible embodiments of the present invention.

A flexible circuit connector for connecting first and second circuit boards of a device includes a first connector, a second connector and a spiral portion. The first connector is configured to connect to the first circuit board and the second connector is configured to connect to the second circuit board. The spiral portion is connected between the first and second connectors and includes a circumferential portion that extends around the second connector.

The flexible circuit connector of the preceding paragraph can optionally include, additionally and/or alternatively, any one or more of the following features, configurations, operations, and/or additional components:

A further embodiment of the foregoing connector, further including a middle portion connected between the first connector and the spiral portion, wherein the middle portion is connected to the first connector at a first bend point, and wherein the middle portion is connected to the spiral portion at a second bend point, and wherein the flexible circuit connector only bends at the first and second bend points when the device is in an operational state.

A further embodiment of any of the foregoing connectors, wherein the first and second bend points are configured such that the first and second connectors are parallel to one another in the operational state.

A further embodiment of any of the foregoing connectors, wherein the spiral portion and the second connector are configured in a common plane during the operational state.

A further embodiment of any of the foregoing connectors, wherein the common plane is configured perpendicular to the middle portion during the operational state.

A further embodiment of any of the foregoing connectors, wherein the middle portion includes a third connector configured to connect to an electronic system separate from the first and second circuit boards.

A further embodiment of any of the foregoing connectors, wherein the circumferential portion extends 360° around the second connector.

A further embodiment of any of the foregoing connectors, wherein the spiral portion is configured to pull out of the common plane toward the first connector when the first and second connectors are pulled apart from one another.

An electronic system includes first and second circuit boards and a flexible circuit connector. The flexible circuit connector is configured to electrically connect the first and second circuit boards. The flexible circuit connector includes first and second connectors and a spiral portion. The first connector is configured to connect to the first circuit board. The second connector is configured to connect to the second circuit board. The spiral portion is connected between the first and second circuit boards and includes a circumferential portion that extends around the second connector.

The electronic system of the preceding paragraph can optionally include, additionally and/or alternatively, any one or more of the following features, configurations, operations, and/or additional components:

A further embodiment of the foregoing system, wherein the flexible circuit connector further includes a middle portion connected between the first connector and the spiral portion, wherein the middle portion is connected to the first connector at a first bend point, and wherein the middle portion is connected to the spiral portion at a second bend point.

A further embodiment of any of the foregoing systems, wherein the flexible circuit connector only bends at the first and second bend points when the device is in an operational state.

A further embodiment of any of the foregoing systems, wherein the first and second circuit boards are parallel to one another in the operational state, and wherein the first and second bend points are configured such that the first and second connectors are parallel to one another in the operational state.

A further embodiment of any of the foregoing systems, wherein the spiral portion and the second connector are configured in a common plane during the operational state.

A further embodiment of any of the foregoing systems, wherein the common plane is configured perpendicular to the middle portion during the operational state.

A further embodiment of any of the foregoing systems, wherein the middle portion includes a third connector configured to connect to an electronic circuit separate from the first and second circuit boards.

A further embodiment of any of the foregoing systems, wherein the circumferential portion extends 360° around the second connector.

A further embodiment of any of the foregoing systems, wherein the electronic system is contained within an airborne munition.

A further embodiment of any of the foregoing systems, wherein the airborne munition includes first and second compartments, and wherein the first compartment is detachable from the second compartment, and wherein the first circuit board is positioned within the first compartment, and wherein the second circuit board is positioned within the second compartment.

A further embodiment of any of the foregoing systems, wherein the spiral portion is configured to pull out of the common plane when the first and second compartments are detached and pulled apart from one another.

A further embodiment of any of the foregoing systems, wherein the operational state comprises the first compartment and the second compartment attached to one another.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A flexible circuit connector for connecting first and second circuit boards of an airborne device, the flexible circuit connector comprising:
a first connector configured to connect to the first circuit board, wherein the first circuit board is positioned within a first compartment of the airborne device;
a second connector configured to connect to the second circuit board, wherein the second circuit board is positioned within a second compartment of the airborne device;
a spiral portion connected between the first and second connectors, wherein the spiral portion comprises a circumferential portion that extends around the second connector, and wherein the entirety of the spiral portion is in a common plane with the second connector during an operational state; and
a middle portion connected between the first connector and the spiral portion, wherein the common plane is configured perpendicular to the middle portion during the operational state;
wherein the first compartment is detachable from the second compartment, and wherein the spiral portion is configured to pull out of the common plane when the first and second compartments are detached and pulled apart from one another.

2. The flexible circuit connector of claim 1, wherein the middle portion is connected to the first connector at a first bend point, and wherein the middle portion is connected to the spiral portion at a second bend point, and wherein the flexible circuit connector only bends at the first and second bend points when the airborne device is in the operational state.

3. The flexible circuit connector of claim 2, wherein the first and second bend points are configured such that the first and second connectors are parallel to one another in the operational state.

4. The flexible circuit connector of claim 2, wherein the operational state comprises the first compartment and the second compartment attached to one another.

5. The flexible circuit connector of claim 2, wherein the middle portion includes a third connector configured to connect to an electronic system separate from the first and second circuit boards.

6. The flexible circuit connector of claim 2, wherein the circumferential portion extends 360° around the second connector.

7. An electronic system contained within an airborne device, the electronic system comprising:
a first circuit board positioned within a first compartment of the airborne device;

a second circuit board positioned within a second compartment of the airborne device; and a flexible circuit connector configured to electrically connect the first and second circuit boards, wherein the flexible circuit connector comprises:

a first connector configured to connect to the first circuit board;

a second connector configured to connect to the second circuit board;

a spiral portion connected between the first and second circuit boards, wherein the spiral portion comprises a circumferential portion that extends around the second connector, and wherein the entirety of the spiral portion is in a common plane with the second connector during an operational state; and a middle portion connected between the first connector and the spiral portion, wherein the common plane is configured perpendicular to the middle portion during the operational state;

wherein the first compartment is detachable from the second compartment, and wherein the spiral portion is configured to pull out of the common plane when the first and second compartments are detached and pulled apart from one another.

8. The electronic system of claim 7, wherein the middle portion is connected to the first connector at a first bend point, and wherein the middle portion is connected to the spiral portion at a second bend point.

9. The electronic system of claim 8, wherein the flexible circuit connector only bends at the first and second bend points when the airborne device is in the operational state.

10. The electronic system of claim 9, wherein the first and second circuit boards are parallel to one another in the operational state, and wherein the first and second bend points are configured such that the first and second connectors are parallel to one another in the operational state.

11. The electronic system of claim 8, wherein the middle portion includes a third connector configured to connect to an electronic circuit separate from the first and second circuit boards.

12. The electronic system of claim 8, wherein the circumferential portion extends 360° around the second connector.

13. The electronic system of claim 7, wherein the airborne device is an airborne munition.

14. The electronic system of claim 10, wherein the operational state comprises the first compartment and the second compartment attached to one another.

* * * * *